US008199924B2

(12) United States Patent
Wertz et al.

(10) Patent No.: US 8,199,924 B2
(45) Date of Patent: Jun. 12, 2012

(54) SYSTEM FOR ACTIVE NOISE CONTROL WITH AN INFINITE IMPULSE RESPONSE FILTER

(75) Inventors: Duane Wertz, Byron, MI (US); Vasant Shridhar, Royal oak, MI (US)

(73) Assignee: Harman International Industries, Incorporated, Northridge, CA (US)

( * ) Notice: Subject to any disclaimer, the term of this patent is extended or adjusted under 35 U.S.C. 154(b) by 407 days.

(21) Appl. No.: 12/425,997

(22) Filed: Apr. 17, 2009

(65) Prior Publication Data

US 2010/0266134 A1 Oct. 21, 2010

(51) Int. Cl.
*H03B 29/00* (2006.01)

(52) U.S. Cl. .................................... 381/71.1; 381/71.11

(58) Field of Classification Search ................. 381/71.1, 381/71.11

See application file for complete search history.

(56) References Cited

U.S. PATENT DOCUMENTS

| | | | | |
|---|---|---|---|---|
| 4,589,137 | A | 5/1986 | Miller | 381/94 |
| 4,628,156 | A | 12/1986 | Irvin | 379/410 |
| 4,654,871 | A | 3/1987 | Chaplin et al. | 381/71 |
| 4,677,678 | A | 6/1987 | McCutchen | 381/72 |
| 4,910,799 | A | 3/1990 | Takayama | 455/296 |
| 4,941,187 | A | 7/1990 | Slater | 381/86 |
| 4,947,356 | A | 8/1990 | Elliott et al. | |
| 4,953,217 | A | 8/1990 | Twiney et al. | 381/72 |
| 4,977,600 | A | 12/1990 | Ziegler | 381/71 |
| 4,985,925 | A | 1/1991 | Langberg et al. | 381/72 |
| 4,998,241 | A | 3/1991 | Brox et al. | 370/32.1 |
| 5,001,763 | A | 3/1991 | Moseley | 381/71 |
| 5,033,082 | A | 7/1991 | Eriksson et al. | 379/410 |
| 5,081,682 | A | 1/1992 | Kato et al. | 381/57 |
| 5,091,954 | A | 2/1992 | Sasaki et al. | 381/72 |
| 5,105,377 | A | 4/1992 | Ziegler, Jr. | 364/724.01 |
| 5,133,017 | A | 7/1992 | Cain et al. | 381/71 |
| 5,138,664 | A | 8/1992 | Kimura et al. | 381/72 |
| 5,170,433 | A | 12/1992 | Elliott et al. | |
| 5,182,774 | A | 1/1993 | Bourk | 381/71 |
| 5,208,868 | A | 5/1993 | Sapiejewski | 381/183 |

(Continued)

FOREIGN PATENT DOCUMENTS

CN 1688179 A 10/2005

(Continued)

OTHER PUBLICATIONS

Extended European Search Report from European Application No. EP 10150426.4-2213, dated May 26, 2010, 7 pgs.

(Continued)

*Primary Examiner* — Elvin G Enad
*Assistant Examiner* — Robert W Horn
(74) *Attorney, Agent, or Firm* — Brinks Hofer Gilson & Lione

(57) ABSTRACT

An active noise control (ANC) system includes at least one infinite impulse response filter (IIR). The IIR filter generates an output signal based on an input signal representative of an undesired sound. The ANC system generates an anti-noise signal based on the output signal of the IIR filter. The anti-noise signal is used to drive a speaker to generate sound waves to destructively interfere with the undesired sound. The ANC system includes an update system to generate update coefficients. The update system determines the stability of the update coefficients. Coefficients of the IIR filter are replaced with the update coefficients. The update system generates a set of update coefficients for each sample of the input signal.

25 Claims, 8 Drawing Sheets

U.S. PATENT DOCUMENTS

| | | | | |
|---|---|---|---|---|
| 5,251,262 | A | 10/1993 | Suzuki et al. | 381/71 |
| 5,276,740 | A | 1/1994 | Inanaga et al. | 381/187 |
| 5,289,147 | A | 2/1994 | Koike et al. | 355/200 |
| 5,305,387 | A | 4/1994 | Sapiejewski | 381/71 |
| 5,321,759 | A | 6/1994 | Yuan | 381/71 |
| 5,337,366 | A * | 8/1994 | Eguchi et al. | 381/71.11 |
| 5,371,802 | A | 12/1994 | McDonald et al. | |
| 5,377,276 | A * | 12/1994 | Terai et al. | 381/71.11 |
| 5,381,473 | A | 1/1995 | Andrea et al. | 379/387 |
| 5,381,485 | A | 1/1995 | Elliott | |
| 5,400,409 | A | 3/1995 | Linhard | 381/92 |
| 5,427,102 | A | 6/1995 | Shimode et al. | 128/653.2 |
| 5,485,523 | A | 1/1996 | Tamamura et al. | 381/71 |
| 5,492,129 | A | 2/1996 | Greenberger | 128/715 |
| 5,493,616 | A | 2/1996 | Iidaka et al. | 381/71 |
| 5,497,426 | A | 3/1996 | Jay | 381/67 |
| 5,499,302 | A * | 3/1996 | Nagami et al. | 381/71.4 |
| 5,526,421 | A | 6/1996 | Berger et al. | 379/389 |
| 5,559,893 | A | 9/1996 | Krokstad et al. | 381/71 |
| 5,586,189 | A * | 12/1996 | Allie et al. | 381/71.11 |
| 5,602,927 | A | 2/1997 | Tamamura et al. | 381/71 |
| 5,602,928 | A | 2/1997 | Eriksson et al. | 381/71 |
| 5,604,813 | A | 2/1997 | Evans et al. | 381/71 |
| 5,621,803 | A * | 4/1997 | Laak | 381/71.11 |
| 5,673,325 | A | 9/1997 | Andrea et al. | 381/92 |
| 5,675,658 | A | 10/1997 | Brittain | 381/72 |
| 5,680,337 | A * | 10/1997 | Pedersen et al. | 708/322 |
| 5,687,075 | A | 11/1997 | Stothers | |
| 5,691,893 | A | 11/1997 | Stothers | |
| 5,692,059 | A | 11/1997 | Kruger | 381/151 |
| 5,699,437 | A | 12/1997 | Finn | |
| 5,706,344 | A | 1/1998 | Finn | 379/410 |
| 5,715,320 | A * | 2/1998 | Allie et al. | 381/71.12 |
| 5,727,066 | A | 3/1998 | Elliott et al. | |
| 5,737,433 | A | 4/1998 | Gardner | 381/94.7 |
| 5,740,257 | A | 4/1998 | Marcus | 381/71.6 |
| 5,745,396 | A * | 4/1998 | Shanbhag | 708/322 |
| 5,768,124 | A | 6/1998 | Stothers et al. | |
| 5,774,564 | A * | 6/1998 | Eguchi et al. | 381/71.11 |
| 5,774,565 | A | 6/1998 | Benning et al. | 381/83 |
| 5,809,156 | A | 9/1998 | Bartels et al. | 381/183 |
| 5,815,582 | A | 9/1998 | Claybaugh et al. | 381/71.6 |
| 5,872,728 | A | 2/1999 | Richter | 364/724.2 |
| 5,937,070 | A | 8/1999 | Todter et al. | 381/71.6 |
| 6,069,959 | A | 5/2000 | Jones | 381/71.6 |
| 6,078,672 | A | 6/2000 | Saunders et al. | 381/71.6 |
| 6,163,610 | A | 12/2000 | Bartlett et al. | 379/433 |
| 6,166,573 | A | 12/2000 | Moore et al. | 327/161 |
| 6,181,801 | B1 | 1/2001 | Puthuff et al. | 381/380 |
| 6,185,299 | B1 | 2/2001 | Goldin | 379/406 |
| 6,278,785 | B1 | 8/2001 | Thomasson | 381/66 |
| 6,295,364 | B1 | 9/2001 | Finn et al. | 381/110 |
| 6,301,364 | B1 | 10/2001 | Lowmiller et al. | 381/66 |
| 6,343,127 | B1 | 1/2002 | Billoud | 381/71.4 |
| 6,347,146 | B1 | 2/2002 | Short et al. | 381/15 |
| 6,377,680 | B1 | 4/2002 | Foladare et al. | 379/392.01 |
| 6,421,443 | B1 | 7/2002 | Moore et al. | 379/406.01 |
| 6,445,799 | B1 | 9/2002 | Taenzer et al. | 381/71.6 |
| 6,445,805 | B1 | 9/2002 | Grugel | 381/330 |
| 6,466,673 | B1 | 10/2002 | Hardy | |
| 6,496,581 | B1 | 12/2002 | Finn et al. | 379/406.01 |
| 6,505,057 | B1 | 1/2003 | Finn et al. | 455/569 |
| 6,529,605 | B1 * | 3/2003 | Christoph | 381/56 |
| 6,532,289 | B1 | 3/2003 | Magid | 379/406.01 |
| 6,532,296 | B1 | 3/2003 | Vaudrey et al. | 381/371 |
| 6,567,524 | B1 | 5/2003 | Svean et al. | 381/71.1 |
| 6,567,525 | B1 | 5/2003 | Sapiejewski | 381/71.6 |
| 6,597,792 | B1 | 7/2003 | Sapiejewski et al. | 381/71.6 |
| 6,625,286 | B1 | 9/2003 | Rubacha et al. | 381/93 |
| 6,633,894 | B1 | 10/2003 | Cole | 708/300 |
| 6,643,619 | B1 | 11/2003 | Linhard et al. | 704/233 |
| 6,665,410 | B1 | 12/2003 | Parkins | 381/71.1 |
| 6,687,669 | B1 | 2/2004 | Schrogmeier et al. | 704/226 |
| 6,690,800 | B2 | 2/2004 | Resnick | 381/73.1 |
| 6,798,881 | B2 | 9/2004 | Thomasson | 379/406.07 |
| 6,845,162 | B1 | 1/2005 | Emborg et al. | 381/71.4 |
| 6,991,289 | B2 | 1/2006 | House | 297/217.4 |
| 7,020,288 | B1 | 3/2006 | Ohashi | 381/71.4 |
| 7,062,049 | B1 | 6/2006 | Inoue et al. | 381/71.4 |
| 7,103,188 | B1 | 9/2006 | Jones | 381/71.9 |
| 7,133,529 | B2 | 11/2006 | Ura | 381/66 |
| 7,333,618 | B2 | 2/2008 | Shuttleworth et al. | 381/57 |
| 7,440,578 | B2 | 10/2008 | Arai et al. | 381/302 |
| 7,469,051 | B2 | 12/2008 | Sapashe et al. | 381/104 |
| 7,574,006 | B2 | 8/2009 | Funayama et al. | 381/71.12 |
| 7,627,352 | B2 | 12/2009 | Gauger, Jr. et al. | 455/569.1 |
| 7,630,432 | B2 * | 12/2009 | Hofmeister | 375/232 |
| 7,773,760 | B2 | 8/2010 | Sakamoto et al. | 381/71.9 |
| 7,808,395 | B2 | 10/2010 | Raisanen et al. | 340/667 |
| 7,873,173 | B2 | 1/2011 | Inoue et al. | 381/71.4 |
| 7,885,417 | B2 * | 2/2011 | Christoph | 381/71.11 |
| 7,933,420 | B2 | 4/2011 | Copley et al. | 381/71.11 |
| 8,027,484 | B2 * | 9/2011 | Yoshida et al. | 381/71.4 |
| 2001/0036283 | A1 | 11/2001 | Donaldson | 381/71.11 |
| 2002/0068617 | A1 | 6/2002 | Han | |
| 2002/0076059 | A1 | 6/2002 | Joynes | 381/71.6 |
| 2002/0138263 | A1 | 9/2002 | Deligne et al. | 704/233 |
| 2002/0143528 | A1 | 10/2002 | Deligne et al. | 704/224 |
| 2002/0172374 | A1 | 11/2002 | Bizjak | 381/71.14 |
| 2002/0176589 | A1 | 11/2002 | Buck et al. | 381/94.7 |
| 2003/0035551 | A1 | 2/2003 | Light et al. | 381/71.6 |
| 2003/0103636 | A1 | 6/2003 | Arai et al. | 381/302 |
| 2003/0142841 | A1 | 7/2003 | Wiegand | 381/172 |
| 2003/0228019 | A1 | 12/2003 | Eichler et al. | 381/71.8 |
| 2004/0037429 | A1 | 2/2004 | Candioty | 381/67 |
| 2004/0076302 | A1 | 4/2004 | Christoph | 381/57 |
| 2005/0175187 | A1 | 8/2005 | Wright et al. | 381/71.12 |
| 2005/0207585 | A1 * | 9/2005 | Christoph | 381/71.11 |
| 2005/0226434 | A1 | 10/2005 | Franz et al. | 381/71.7 |
| 2005/0232435 | A1 | 10/2005 | Stothers et al. | |
| 2006/0098809 | A1 | 5/2006 | Nongpiur et al. | 379/406.14 |
| 2006/0153394 | A1 | 7/2006 | Beasley | 381/57 |
| 2006/0251266 | A1 | 11/2006 | Saunders et al. | 381/71.1 |
| 2006/0262935 | A1 | 11/2006 | Goose et al. | 381/17 |
| 2007/0053532 | A1 | 3/2007 | Elliott et al. | |
| 2007/0098119 | A1 | 5/2007 | Stothers et al. | |
| 2007/0253567 | A1 | 11/2007 | Sapiejewski | 381/71.6 |
| 2007/0274531 | A1 | 11/2007 | Camp | 381/74 |
| 2008/0095383 | A1 | 4/2008 | Pan et al. | 381/71.11 |
| 2008/0181422 | A1 | 7/2008 | Christoph | 381/73.1 |
| 2008/0192948 | A1 | 8/2008 | Kan et al. | 381/71.4 |
| 2008/0247560 | A1 | 10/2008 | Fukuda et al. | 381/71.6 |
| 2009/0067638 | A1 | 3/2009 | Sakamoto et al. | 381/71.4 |
| 2009/0086990 | A1 * | 4/2009 | Christoph | 381/71.12 |
| 2009/0086995 | A1 | 4/2009 | Christoph et al. | |
| 2009/0220102 | A1 | 9/2009 | Pan et al. | 381/71.11 |
| 2010/0014685 | A1 * | 1/2010 | Wurm | 381/71.11 |
| 2010/0061566 | A1 | 3/2010 | Moon et al. | 381/71.8 |
| 2010/0098263 | A1 | 4/2010 | Pan et al. | 381/71.11 |
| 2010/0098265 | A1 | 4/2010 | Pan et al. | 381/94.1 |
| 2010/0124336 | A1 | 5/2010 | Shridhar et al. | 371/71.4 |
| 2010/0124337 | A1 | 5/2010 | Wertz et al. | 381/71.11 |
| 2010/0177905 | A1 * | 7/2010 | Shridhar et al. | 381/71.11 |
| 2010/0226505 | A1 | 9/2010 | Kimura | 381/71.6 |
| 2010/0239105 | A1 | 9/2010 | Pan | 381/94.9 |
| 2010/0260345 | A1 * | 10/2010 | Shridhar et al. | 381/71.1 |
| 2010/0266134 | A1 * | 10/2010 | Wertz et al. | 381/71.1 |
| 2010/0266137 | A1 | 10/2010 | Sibbald et al. | 381/71.6 |
| 2010/0272275 | A1 | 10/2010 | Carreras et al. | |
| 2010/0272276 | A1 | 10/2010 | Carreras et al. | 381/71.6 |
| 2010/0272280 | A1 | 10/2010 | Joho et al. | 381/71.6 |
| 2010/0272281 | A1 | 10/2010 | Carreras et al. | 381/71.6 |
| 2010/0274564 | A1 | 10/2010 | Bakalos et al. | 704/500 |
| 2010/0290635 | A1 | 11/2010 | Shridhar et al. | 381/71.1 |
| 2010/0296669 | A1 | 11/2010 | Oh et al. | 381/109 |
| 2011/0116643 | A1 | 5/2011 | Tiscareno et al. | 381/58 |

FOREIGN PATENT DOCUMENTS

| | | | |
|---|---|---|---|
| EP | 0 622 779 | A2 | 11/1994 |
| EP | 0 539 940 | B1 | 4/1996 |
| EP | 0 572 492 | B1 | 11/1997 |
| EP | 1 577 879 | B1 | 7/2008 |
| EP | 1 947 642 | A1 | 7/2008 |
| GB | 2 293 898 | B | 4/1996 |
| JP | 61-112496 | | 5/1986 |
| JP | 06-318085 | | 11/1994 |
| JP | 06-332474 | | 12/1994 |

| | | | |
|---|---|---|---|
| JP | 08-095579 | | 4/1996 |
| JP | 08-234767 | | 9/1996 |
| JP | 10-207470 | | 8/1998 |
| JP | 11 259078 | A | 9/1999 |
| JP | 2007-253799 | | 10/2007 |
| JP | 2008-203828 | | 9/2008 |
| WO | WO 90/09655 | | 8/1990 |
| WO | WO 94/09480 | | 4/1994 |
| WO | WO 94/09481 | | 4/1994 |
| WO | WO 94/09482 | | 4/1994 |
| WO | WO 95/26521 | | 10/1995 |
| WO | WO 96/10780 | | 4/1996 |

OTHER PUBLICATIONS

Martins C R et al., "Fast Adaptive Noise Canceller Using the LMS Algorithm", Proceedings of the International Conference on Signal Processing Applications and Technology, vol. 1, Sep. 28, 1993, 8 pgs.

European Search Report from European Application No. EP 10162225, dated Oct. 1, 2010, 5 pgs.

Gonzalez, A. et al., "Minimisation of the maximum error signal in active control", IEEE International Conference on Acoustics, Speech, and Signal Processing, 1997, 4 pgs.

Gao, F. X. Y. et al., "An Adaptive Backpropagation Cascade IIR Filter," *IEEE*, vol. 39, No. 9, 1992, pp. 606-610.

Kuo, S. M. et al., "Active Noise Control Systems: Algorithms and DSP Implementations," John Wiley & Sons, Inc., New York, NY, Copyright 1996, pp. 88-97.

Kuo, S. M. et al., "Active. Noise Control Systems: Algorithms and DSP Implementations," John Wiley & Sons, Inc., New York, NY, Copyright 1996, 419 pgs.

Colin H. Hansen et al., "Active Control of Noise and Vibration," E & FN Spon., London SE1, Copyright 1997, pp. 642-652.

Notice of Allowance, dated Nov. 2, 2011, pp. 1-9, U.S. Appl. No. 12/275,118, U.S. Patent and Trademark Office, Virginia.

Office Action, dated Aug. 26, 2011, pp. 1-24, U.S. Appl. No. 12/421,459, U.S. Patent and Trademark Office, Virginia.

Office Action, dated Jul. 25, 2011, pp. 1-11, U.S. Appl. No. 12/275,118, U.S. Patent and Trademark Office, Virginia.

Office Action, dated Aug. 3, 2011, pp. 1-33, U.S. Appl. No. 12/352,435, U.S. Patent and Trademark Office, Virginia.

Office Action, dated Sep. 13, 2011, pp. 1-16, U.S. Appl. No. 12/420,658, U.S. Patent and Trademark Office, Virginia.

Notice of Allowance, dated Aug. 15, 2011, pp. 1-14, U.S. Appl. No. 12/466,282, U.S. Patent and Trademark Office, Virginia.

Chen, Kean et al., Adaptive Active Noise Elimination and Filter-XLMS Algorithm, 1993, pp. 27-33, vol. 12 (4), Applied Acoustics, and translation of Abstract (8 pgs.).

Japanese Office Action, dated Dec. 26, 2011, pp. 1-5, Japanese Patent Application No. 2010-089051, Japanese Patent Office, Japan.

Office Action, dated Feb. 14, 2012, pp. 1-36, U.S. Appl. No. 12/352,435, U.S. Patent and Trademark Office, Virginia.

Notice of Allowance, dated Feb. 2, 2012, U.S. Appl. No. 12/421,459, U.S. Patent and Trademark Office, Virginia.

Office Action, dated Mar. 7, 2012, pp. 1-13, U.S. Appl. No. 12/420,658, U.S. Patent and Trademark Office, Virginia.

* cited by examiner

SYSTEM FOR ACTIVE NOISE CONTROL WITH AN INFINITE IMPULSE RESPONSE FILTER

BACKGROUND OF THE INVENTION

1. Technical Field

This invention relates to active noise control, and more specifically to active noise control using at least one infinite impulse response filter.

2. Related Art

Active noise control may be used to generate sound waves that destructively interfere with a targeted undesired sound. The destructively interfering sound waves may be produced through a loudspeaker to combine with the targeted undesired sound.

An active noise control system generally includes at least one adaptive finite impulse response (FIR) filter. FIR filters are typically used due to low incidence of system instability. FIR filters generally display longer convergence times as compared to infinite impulse response (IIR) filters. While IIR filters may provide lower convergence times as compared to FIR filters, use of IIR filters may result in more instances of system instability. Therefore, a need exists to control IIR filter stability in active noise control systems.

SUMMARY

An active noise control (ANC) system may implement at least one adaptive infinite impulse response (IIR). The IIR filter may receive an input signal representative of an undesired sound. The IIR filter may generate an output signal based on the input signal. The ANC system may generate an anti-noise signal based on the output signal of IIR filter. The anti-noise signal may be used to drive a speaker to generate sound waves to destructively interfere with the undesired sound.

The IIR filter may include a plurality of filter coefficients used to generate the output signal based on the input signal. The ANC system may include an update system to update the filter coefficients of the IIR filter. The update system may generate a plurality of update coefficients based on each sample of the input signal being received by the IIR filter. The update system may determine the stability of the update coefficients. The coefficients of the IIR filter may be replaced with the update coefficients when the update coefficients are determined to be stable.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

An active noise control system may be configured to generate destructively interfering sound waves. This is accomplished generally by first determining presence of an undesired sound and then generating the destructively interfering sound waves. The destructively interfering sounds wave may be transmitted as a speaker output. A microphone may receive sound waves from the speaker output and the undesired sound. The microphone may generate an error signal based on the sound waves. The active noise control system may include at least one adaptive infinite impulse response (IIR) filter. The output signal of the adaptive IIR filter may be used to generate a signal to drive the speaker to produce the destructively interfering sound waves. An update system may determine update coefficients for the IIR filter. Determination of the update coefficients may be based on the output signal of the IIR filter.

Figure 1:
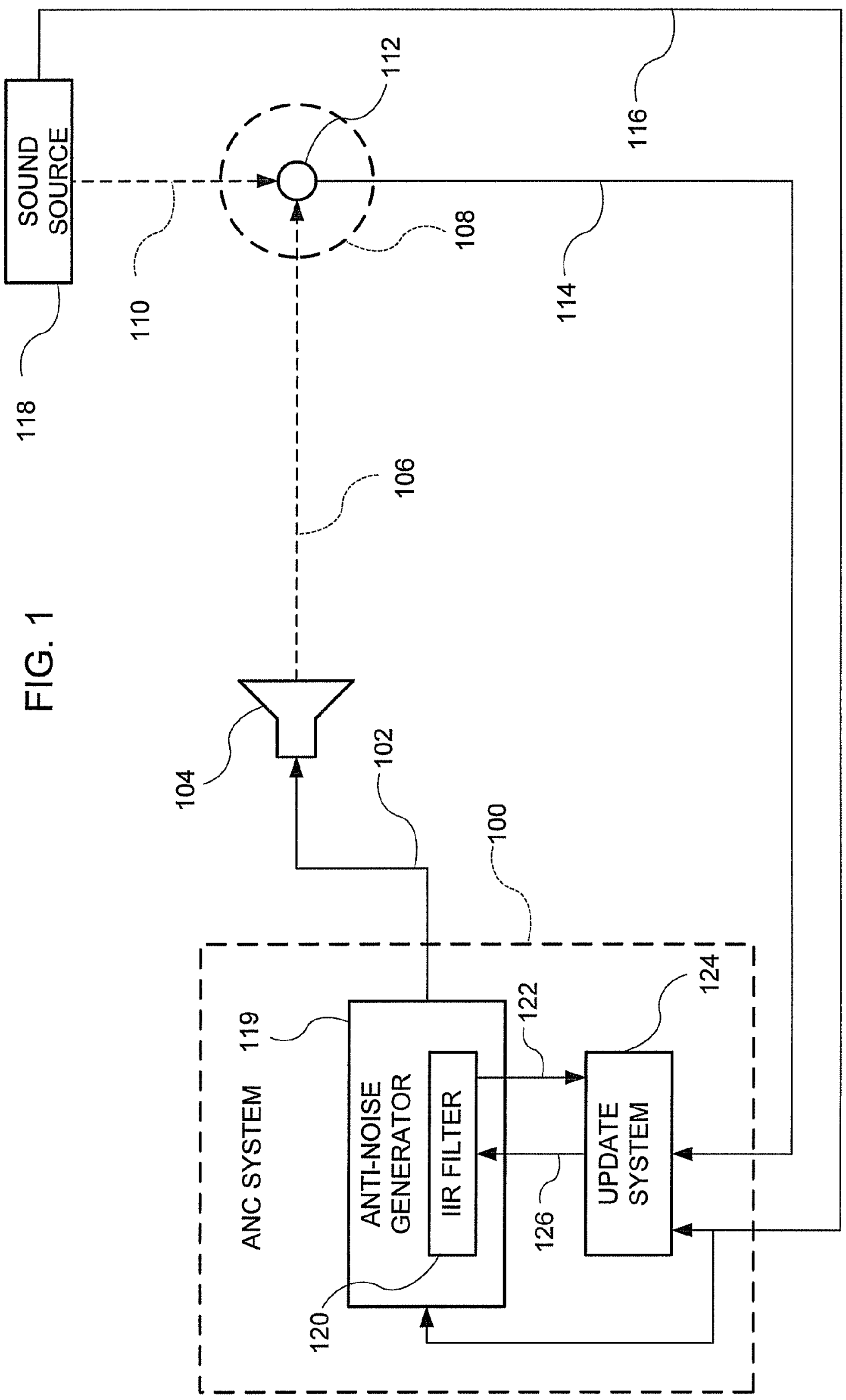
FIG. 1 is a diagrammatic view of an example active noise control (ANC) system.

In FIG. 1, an example active noise control (ANC) system 100 is diagrammatically shown. The ANC system 100 may be used to generate an anti-noise signal 102, which may be provided to drive a speaker 104 to produce sound waves as speaker output 106. The speaker output 106 may be transmitted to a target space 108 to destructively interfere with an undesired sound 110 present in a target space 108. In one example, anti-noise may be defined by sound waves of approximately equal amplitude and frequency and approximately 180 degrees out of phase with the undesired sound 110. The 180 degree shift of the anti-noise signal will cause destructive interference with the undesired sound in an area in which the anti-noise sound waves and the undesired sound 110 sound waves combine such as the target space 108. The ANC system 100 may be configured to generate anti-noise associated with various environments. For example, the ANC system 100 may be used to reduce or eliminate particular sounds present in a vehicle as perceived by a listener. In one example, the target space 108 may be selected in which to reduce or eliminate sounds related to vehicle operation such as engine noise or road noise. In one example, the ANC system 100 may be configured to eliminate an undesired sound with a frequency range of approximately 20-500 Hz.

A microphone 112 may be positioned within or proximate to the target space 108 to detect sound waves present in the target space 108. In one example, the target space 108 may detect sound waves generated from the combination of the speaker output 106 and the undesired sound 110. The detection of the sound waves by the microphone 112 may cause an output signal to be generated by the microphone 112. The output signal may be used as an error signal 114. An input signal 116 may also be provided to the ANC system 100. The input signal 116 may be representative of the undesired sound 110 emanating from a sound source 118. The ANC system 100 may generate the anti-noise signal 102 based on the input signal 116. The ANC system 100 may use the error signal 114 to adjust the anti-noise signal 102 to more accurately cause destructive interference with the undesired sound 110 in the target space 108.

In one example, the ANC system 100 may include an anti-noise generator 119. The ANC system 100 may be configured to include any number of anti-noise generators 119. The anti-noise generator 119 may be configured to generate the anti-noise signal 102 using at least one adaptive infinite impulse response (IIR) filter 120. In one example, the IIR filter 120 may converge faster than a finite impulse response (FIR) filter may converge when configured for use in the ANC system 100. Convergence speed may contribute to how quickly the anti-noise signal 102 is adapted to accurately cancel the undesired sound 110 in the target space 110. In alternative examples, the ANC system 100 may include additional IIR filters. The adaptive IIR filter 120 may produce an IIR filter output signal 122 used to generate the anti-noise signal 102. The IIR filter 120 may include a plurality of filter coefficients that may be adapted based on the error signal 114 and the input signal 116. The coefficients of the IIR filter 120 may be updated using an update system 124.

The update system 124 may be configured to provide update coefficients 126 to the IIR filter 120. The update system 124 may determine update coefficients 126 based on the error signal 114, the input signal 116, and the IIR filter output signal 122. In one example, update coefficients 126 may be determined for the IIR filter 120 between processing of samples of the input signal 116. Between each sample, the update system 124 may determine the update coefficients 126 and determine the stability of the updated coefficients 126. If the update coefficients 126 are stable, the update coefficients 126 may replace the current coefficients in the IIR filter 120 for subsequent samples of the input signal 116. If the update coefficients 126 are determined to be unstable, the IIR filter 120 may use the current coefficients for the subsequent samples of the input signal 116. The update system 124 may determine update coefficients between each sample of the input signal 116 provided to the anti-noise generator 119. Alternatively, the update system 124 may be configured to operate in parallel with the anti-noise generator 119.

Figure 2:
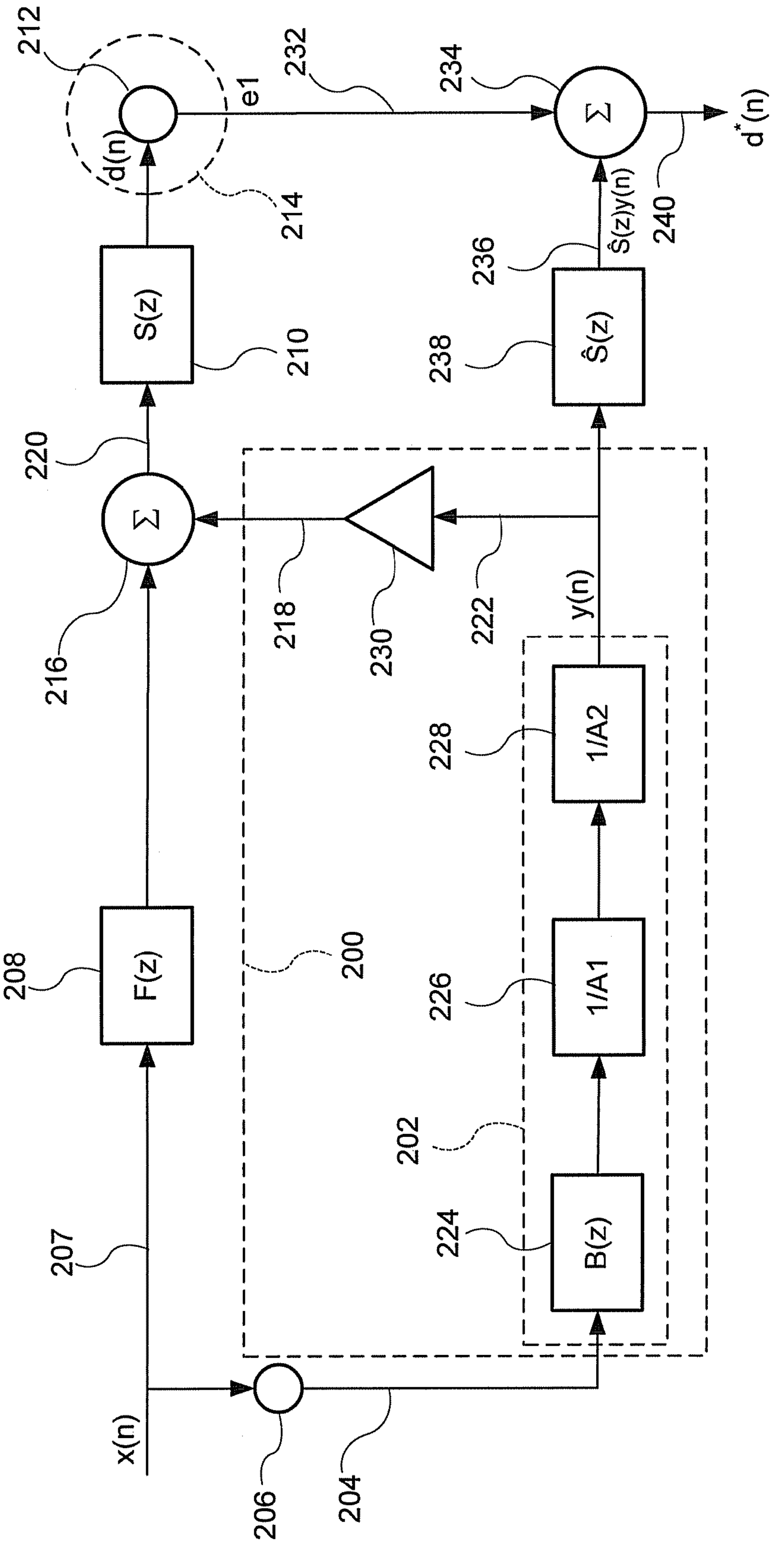
FIG. 2 is a block diagram of an example configuration implementing an ANC system.

In FIG. 2, an example ANC system 200 is shown in a Z-domain block diagram format. The ANC system 200 may include an IIR filter 202. The ANC system 200 may be configured to receive an input signal 204 representative of an undesired sound 207. In FIG. 2, "x(n)" may represent the state of the undesired sound 207 at a point of origin, detection, or both. The input signal 204 may be generated by a sensor 206, which may generate the input signal 204 based on receipt of the undesired sound (x(n)) 207. In one example, the sensor 206 may be a microphone configured to detect an undesired sound (x(n)) 207 and generate a representative signal in response to the detection. Alternatively, the input signal 204 may be based on a simulation of the undesired sound (x(n)) 207.

The undesired sound 207 may propagate through a physical path that includes a first path 208 and second path 210 to reach a microphone 212 disposed within a target space 214. In FIG. 2, the first path 208 is represented by Z-domain transfer function F(z) and the second path 210 is represented as Z-domain transfer function S(z). The target space 214 may be a three-dimensional space targeted for cancellation the undesired sound 207 through generation of anti-noise. The first path 208 may represent the physical path traversed by the undesired sound 207 from an undesired sound source to a speaker 216 represented as a summation operation. An anti-noise signal 218 generated by the ANC system 200 may drive the speaker 216 to produce anti-noise that is combined with the undesired sound 207 at or proximate to the speaker 216. Sound waves 220 may include the combination of the undesired sound 207 and anti-noise based on the anti-noise signal 218. The anti-noise may traverse the second path 210 to the microphone 212. As the undesired sound 207 traverses the first path 208 and the second path 210, the state of the undesired sound 207 may change as perceived by a listener. As a result, the state of the undesired sound 207 as it combines with anti-noise at or proximate to the speaker 216 may be different than the state of the undesired sound 207 at its point of origin. Also, the undesired sound 207 may sound differently to a listener in the target space 214 than the undesired sound 207 would sound to a listener at the source of the undesired sound 207.

In FIG. 2, the state of the undesired sound 207 at or proximate to the microphone 212 may be represented as "d(n)". As described, the undesired sound (d(n)) 207 may be perceived sound different to a listener than the undesired sound (x(n)) 207 at the source of the undesired sound. The undesired sound (d(n)) 207 at the microphone 212 may be the sound targeted to be reduced or eliminated because d(n) may be the state of the undesired sound 207 at the microphone perceived by a listener in the target space 214.

The anti-noise signal 218 may be generated based on an output signal 222 of the IIR filter 202. The IIR filter 202 may include a plurality of filters cascaded in series. Each filter may include a respective transfer function. In FIG. 2, the IIR filter 202 may include a first filter 224, a second filter 226, and a second filter 228. Generally a digital filter, may be represented by the relationship of:

$$Y(z)=H(z)X(z) \qquad \text{Eqn. 1}$$

where X(z) may be an input function, Y(z) may be an output function, and H(z) may be a transfer function representing the filter that relates the input and output functions to one another. The transfer function H(z) may also be represented by:

$$H(z)=\frac{B(z)}{A(z)} \qquad \text{Eqn. 2}$$

where $$B(z)=\sum_{q=0}^{\infty} b_q z^{-q} \qquad \text{Eqn. 3}$$

and $$A(z)=1+\sum_{p=1}^{\infty} a_p z^{-p} \qquad \text{Eqn. 4}$$

In Eqn. 3, B(z) may be a function of the $-q^{th}$ order and $b_q$ may represent each coefficient corresponding to an associated term in B(z). In Eqn. 4, A(z) may be a function of the $-p^{th}$ order and $a_p$ represents each coefficient corresponding to an associated term in A(z).

In a finite impulse response (FIR) filter, A(z) is one (=1) resulting in H(z) being B(z) in Eqn. 2. In an IIR filter, A(z) may be a non-zero function, which may create the possibility of instability in an IIR filter using a non-zero A(z) function. In one example, A(z) may be selected such that the denominator of H(z) may be factored into one or more biquadratic equation ("biquad") sections. Each biquad may be a second-order equation allowing the roots of each second-order equation to be determined. Representing A(z) as one or more biquad sections allows an IIR filter to be represented by a plurality of second-order, cascaded filters, such as the second filter 226 and the third filter 228. Alternatively, A(z) may be selected allowing factorization into one or more biquad sections and a first order equation.

In accordance with Eqn. 3, one of the cascaded filters may include coefficients associated with B(z) such that:

$$B(z)=b_0+b_1z^{-1}+b_1z^{-2} \quad \text{Eqn. 5}$$

In FIG. 2, the first filter 224 or "transversal" filter may be represented by B(z). The number and value of coefficients included in B(z) may be predetermined and adapted during operation of the ANC system 200. In one example, the second filter 226 and the third filter 228 of the IIR filter 202 may each be represented by biquad section filters in accordance with Eqn. 4 such as:

$$A_1(z)=1+a_{11}z^{-1}+a_{12}z^{-2} \quad \text{Eqn. 6}$$

and $$A_2(z)=1+a_{21}z^{-1}+a_{22}z^{-2} \quad \text{Eqn. 7}$$

The value of the coefficients of $A_1(z)$, $a_{11}$ and $a_{12}$, and the coefficients of $A_2(z)$, $a_{21}$ and $a_{22}$, may be predetermined prior to initial operation of the ANC system 200 and adapted during operation.

The output signal 222 represents the IIR filter 202 attempting to create a signal representative of the undesired sound 207 at the microphone 212, and thus the IIR filter 202 may represent an estimation of F(z). An inverter 230 may receive the output signal 222. The inverter 230 may invert the output signal 222 to produce the anti-noise signal 218. The inversion of the output signal 222 shifts the phase of the output signal 222 by approximately 180 degrees allowing anti-noise to be produced by the speaker 216.

The microphone 212 may detect sound waves resulting from the combination of the anti-noise and the undesired sound (d(n)) 207. The microphone 212 may generate an output signal representative of a portion of the undesired sound (d(n)) 207 not canceled by the anti-noise. The output signal generated by the microphone 212 may be used as an error signal ($e_1$) 232 used by the IIR filter 202 to adjust the accuracy of the anti-noise.

The error signal 232 may be provided to a summation operation 234 in which the error signal 232 is added to a filtered output signal 236. The filtered output signal 236 may be the output signal 222 of the IIR filter 202 filtered by an estimated path filter 238. The estimated path filter 238 represents an estimation of the second path 210. The estimated path filter 238 is represented by Z-domain transfer function $\hat{S}(z)$. The sum of the filtered output signal ($\hat{S}(z)y(n)$) 236 and the error signal ($e_1$) 232 may produce an update signal (d*(n)) 240 approximating the undesired sound x(n) at the microphone 212. The update signal may be represented by:

$$d^*(n)=e_1+(\hat{S}(z)y(n)) \quad \text{Eqn. 8}$$

The update signal 240 may be the actual targeted sound for cancellation since this is the state of the undesired sound x(n) in the target space 214.

In FIG. 2, the update signal (d*(z)) 240 may represent the approximated state of the undesired sound (d(n)) 207 at the microphone 212. The state of the undesired sound 207 may change as it propagates through one or more mediums. As a result, the undesired sound (d(n)) 207 at the microphone 212 may be different than that represented by the input signal 204, representing x(n), input into the IIR filter 202. Generating anti-noise to approximate d(n) may allow the ANC system 200 to more accurately generate anti-noise.

Figure 3:
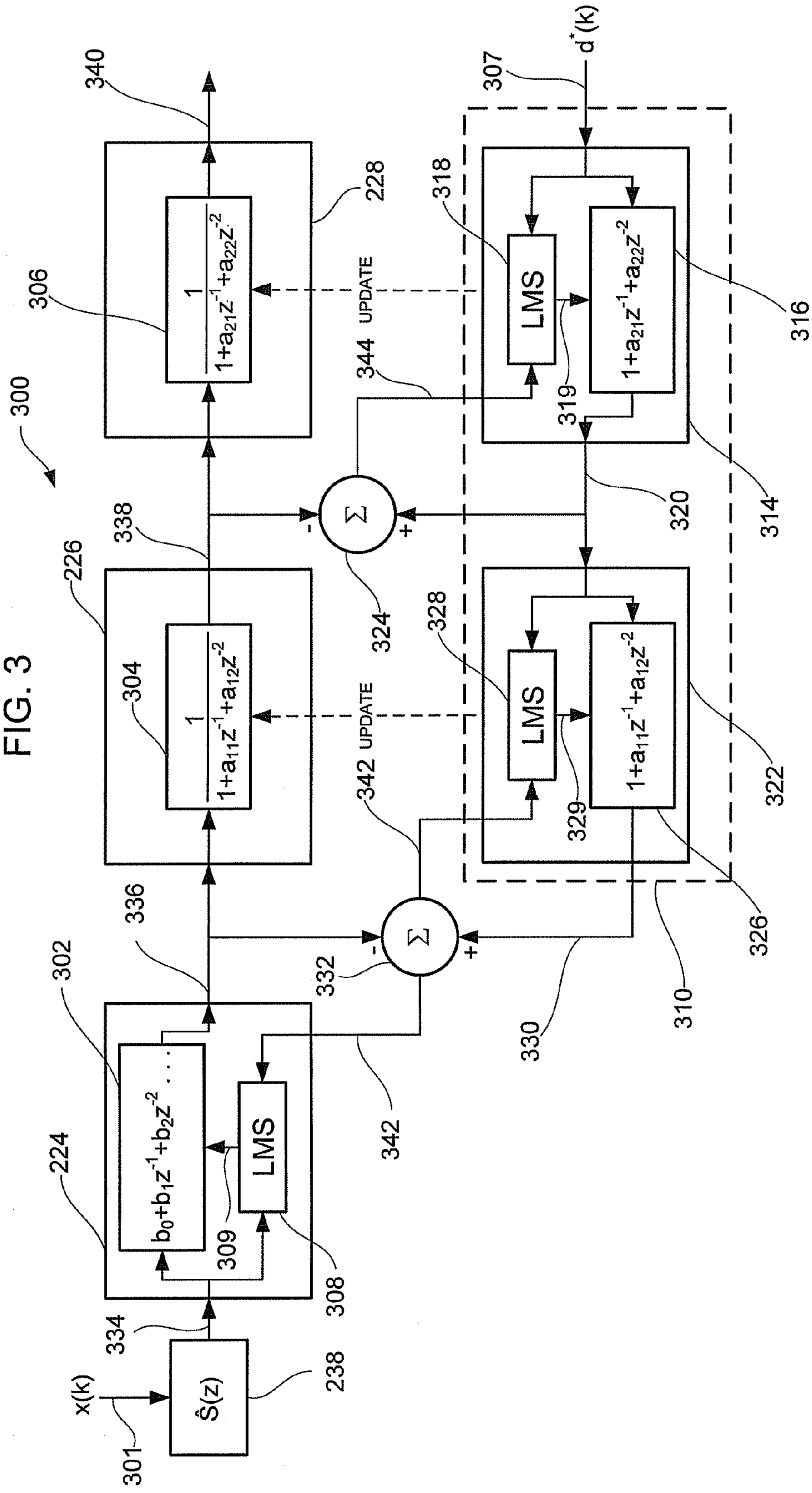
FIG. 3 is a block diagram of an example filter coefficient update system implemented by the ANC system of FIG. 2.

Coefficients of the adaptive IIR filter 202 may be updated in order to adjust the output signal 222 in order to adjust the accuracy of generated anti-noise. In FIG. 3, a filter update system 300 implementing a backpropagation update configuration for the adaptive IIR filter 202 is shown. In one example, the undesired sound input signal 204 may include a plurality of samples. Each sample processed by the adaptive IIR filter 202 may ultimately generate a corresponding sample of the output signal 218. The update configuration of FIG. 3 may attempt to update the coefficients associated with the adaptive IIR filter 202 on a sample-by-sample basis. For example, in FIG. 3, an input signal sample 301 of the input signal 204 may be designated as x(k), with k being a sample index. The sample x(k) may have propagated through the ANC system 200 to contribute to anti-noise generation. Before the next sample, x(k+1), is received by the ANC system 200 and propagated through to contribute to anti-noise generation, the coefficients of the adaptive IIR filter 202 may be updated.

The adaptive IIR filter 202 may be updated "offline," in other words, updated between the input samples being used to generate anti-noise. An update routine implementing backpropagation may be performed using an update system 300 shown in FIG. 3. The last input signal sample (x(k)) 301 having propagated through the ANC system 200 may be stored for updating the adaptive IIR filter 202. In one example, history buffers for the ANC system 200 and the update system 300 may be different from one another.

In FIG. 3, the first filter 224, second filter 226, and third filter 228 each include a first adaptive filter portion 302, second adaptive filter portion 304, and third adaptive filter portion 306, respectively. The first filter 224 may referred to as a transversal filter and include a learning algorithm unit (LAU) 308. In FIG. 3, the LAU 308 may implement a least mean squares (LMS) routine. However, other learning algorithms may be used, such as recursive least mean squares (RLMS), normalized least mean squares (NLMS), or any other suitable learning algorithm. As previously described, the first filter 224 includes a predetermined number of coefficients. The coefficients of the first filter 224 may be implemented in the adaptive filter portion 302 representing the transfer function of the first filter 224. The second adaptive filter portion 304 and the third adaptive filter portion 306 may each include a transfer function represented as a biquad section resulting in two coefficients for the second adaptive filter portion 304 and the third adaptive filter portion 306.

In order to determine the stability of updated filter coefficients to be used for the second adaptive filter portion 304 and third adaptive filter portion 306, a backpropagation routine may be implemented. In FIG. 3, the undesired sound 207 at sample index k, d(k) (not shown), may be considered as the state of the undesired sound 207 targeted for reduction or elimination by the ANC system 200 based on the input signal sample x(k) 301. Thus, an estimated undesired sound sample (d*(k)) represents: $e_1(k)+(y(k))\hat{S}(z)$, where y(k) is the output signal 222 (FIG. 2) at sample index k, $e_1(k)$ is the error signal 232 (FIG. 2) at sample index k, and $\hat{S}(z)$ is the transfer function of the estimated path filter 238 (FIG. 2). The estimated undesired sound sample (d*(k)) may represent an update signal sample 307 of the update signal 240.

The update system 300 may include a number of update filters 310. The update filters 310 may be serially cascaded as shown in FIG. 3. The update signal sample (d*(k)) 307 may be input into a first update filter 314 having an first adaptive update filter portion 316 with a transfer function that is the reciprocal transfer function of the third adaptive filter portion 306, such that the first update filter 314 is functionally an FIR filter. The first update filter 314 may also include an LAU 318 configured to provide a first filter update signal 319 to the filter portion 316. In FIG. 3, the LAU 318 may implement a LMS routine, recursive least mean squares (RLMS), normalized least mean squares (NLMS), or any other suitable learning algorithm. The first update filter 314 generates a first update filter output signal 320 that may be provided to a second update filter 322, as well as a first operator 324.

The second update filter 322 may include a second adaptive update filter portion 326 having a transfer function that is the reciprocal transfer function of the second adaptive filter portion 304. The second update filter 322 may also include an LAU 328 configured provide a first coefficient update signal 329 to the second adaptive update filter portion 326 to update the respective coefficients. The second update filter 322 may generate a second update filter output signal 330. The second update filter output signal 330 may be provided to a second operator 332.

As the d*(k) sample 307 is provided to the first update filter 314, the associated input signal sample x(k) 301 may be input into the update system 300. The input signal sample (x(k)) 301 may be provided to the estimated path filter 238. The filtered input signal sample 334 is provided to the first filter 224 including the first adaptive filter portion 302 and the LAU 308. The first filter 224 may generate a first intermediate output signal 336 based on the filtered input sample 334. The first intermediate output signal 336 may be provided to the second filter 226 and to the second operator 332. The second filter 226 may generate a second intermediate output signal 338 based on the first intermediate output signal 336. The second intermediate output signal 338 may be provided to the third filter 228 and the first operator 324. The third filter 228 may generate a filter output signal 340. The filter output signal 340 may be disregarded in the update system 300.

Processing of the signal samples 301 and 307 and the intermediate output signals 320, 330, 336, and 338 by the respective filters may allow intermediate error signals to be generated. For example, a first intermediate error signal 342 may be generated at the second operator 332 by subtracting the first intermediate output signal 336 from the second update filter output signal 330. The first intermediate error signal 342 may be provided to the first filters 224 and the second update filter 322. The first filter 224 and the second update filter 332 may use the first intermediate error signal 342 to update the respective coefficients through the LAUs 308 and 328, respectively. Similarly, a second intermediate error signal 344 may be generated at the first operator 324 by subtracting the second intermediate output signal 338 from the first update filter output signal 320. The second intermediate error signal 344 may be provided to the LAU 318 of the first update filter 314 to update the coefficients of the first adaptive update filter portion 316. The LAU 308 may use the intermediate error signals 342, as well as the filtered input signal 334 to generate an update signal 309. The LAUs 318 and 328 may use the intermediate error signals 344 and 342, respectively, and the intermediate output signals 320 and 330, respectively, to generate an update signal 319 and 329, respectively, which is provided to the respective filter portions 316 and 326.

Upon updating the coefficients for the second filter portion 316 and the second adaptive update filter portion 326, stability determinations may be made for the coefficients. In one example, the coefficients for the adaptive update filter portions 316 and 326 may be checked for stability by determining a region of stability for each set of coefficients for the corresponding update filter 316 and 326. For example, the stability may be determined through the following equations:

$$1+a_{i1}-a_{i2}>0 \quad \text{Eqn. 9}$$

$$1+a_{i1}+a_{i2}>0 \quad \text{Eqn. 10}$$

$$1+a_{i2}>0 \quad \text{Eqn. 11}$$

where $a_{i1}$ and $a_{i2}$ are the set of coefficients for each biquad. If Eqns. 9-11 are true for a set of biquad coefficients, then the coefficients are stable. If any one of the Eqns. 9-11 is false, the coefficients are unstable.

If the update coefficients of both filter portions 316 and 326 are determined to be stable, the corresponding adaptive filter portions 306 and 304, respectively, may each have the coefficients updated to include the update coefficients. For example, if the update coefficients of the adaptive update filter portions 316 and 326 are determined to be stable, the third adaptive filter portion 306 may be updated with the update coefficients of the first adaptive update filter portion 316 and the coefficients of the second adaptive filter portion 304 may be updated with the coefficients of the second adaptive update filter portion 326.

If any of the update coefficients of the update filters 314 and 322 are determined to be unstable, none of the coefficients may be used to update a corresponding filter. For example, in FIG. 3, if one of the updated coefficients of the filter portion 326 is determined to be unstable, none of the updated coefficients of either adaptive update filter portions 316 and 326 are used to update the adaptive filter portions 306 and 304, respectively. In the instance of instability, the filter 224 also may not use coefficients based on the signal sample 301. If the coefficients are not used to update the filters 224, 226, and 228, the filters 224, 226, and 228 may continue to use the current coefficients for the next input signal sample x(k+1). The decision to update or not update a particular filter may be performed on a sample-by-sample basis. Once updating decisions and associated updates occur, the filters 224, 226, and 228 may be in condition to receive the next input sample x(k+1).

Figure 4:
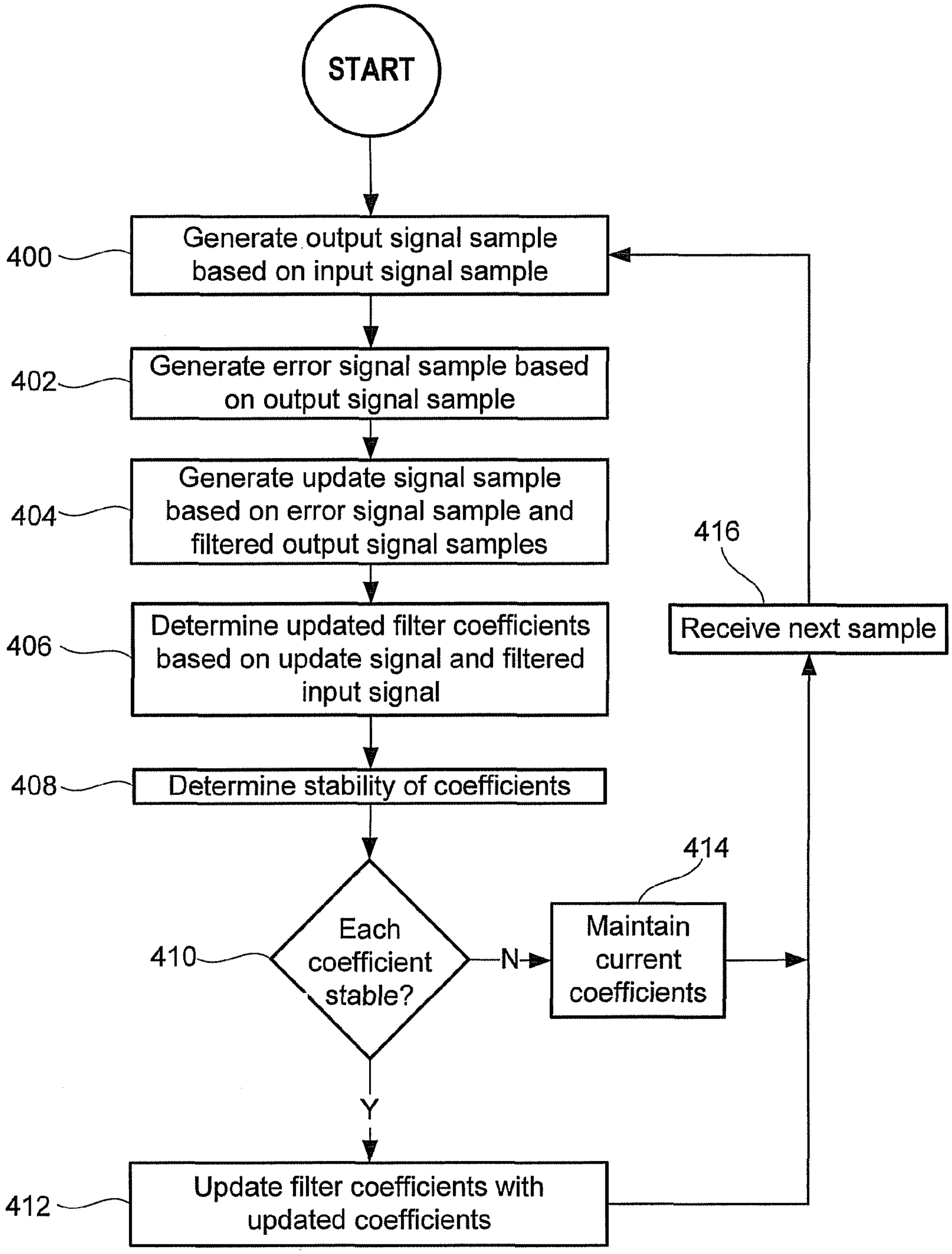
FIG. 4 is an example operational flow diagram of the ANC system of FIGS. 2 and 3.

FIG. 4 is a flow diagram of an example operation of an ANC system configured to generate anti-noise using adaptive IIR filters, such as the ANC system 200. The operation may include a step 400 of generating an output signal sample based on an input signal sample. In the ANC system 200, the step 400 may be performed by providing an input signal sample (x(k)) 301 to the IIR filter 202. The IIR filter 202 may include the cascaded filters 224, 226, and 228. Each sample of the input signal 204 may generate an associated sample of the output signal 222. The output signal 222 may be inverted to generate the anti-noise signal 218.

The operation may include a step 402 of generating an error signal sample based on the output signal sample. In the ANC system 200, the error signal 232 may be an output signal generated by the microphone 212. The error signal 232 may be received by the ANC system 200. The error signal 232 may represent sound waves detected by the microphone 212 resulting from the combination at the microphone 212 of speaker output representing anti-noise and the undesired sound (d(n)) 207 proximate to the microphone 212. A sample of the error signal 232 may be corresponding to a sample of the output signal 222.

The operation may include a step 404 of generating an update signal sample d*(k) based on the error signal sample 232 and a filtered output signal sample 236. In one example, the update signal sample d*(k) may be generated by summing an error signal sample and an output signal sample of the IIR filter 202 filtered by the estimated path filter 238, as shown in the ANC system 200. In the ANC system 200, a sample y(k) of the output signal 222 of the anti-noise generator filter 202 is filtered by the estimated path filter 238 and summed with a corresponding sample $e_1(k)$ of the error signal 232 at the summation operator 234. The resulting signal is the update signal 240 representing the estimated undesired sound d*(n) at the corresponding sample index k. In FIG. 3, the estimated undesired sound signal (d*(n)) 240 at a sample index k is represented by the update signal sample (d*(k)) 307.

The operation may include a step 406 of determining updated filter coefficients based on the update signal sample d*(k) and a filtered input signal sample. Step 406 may be performed in the ANC system 200 using the update system 300 in FIG. 3. Each sample of the input signal 204 may be processed by the ANC system 200 to generate a corresponding sample of the anti-noise signal 218 used to drive the speaker 216 to produce anti-noise. Between each processed sample, the update system 300 may use the IIR filter 202 to update the coefficients of the first filter 224, second filter 226, and third filter 228.

Between each sample of the input signal 204 provided to the ANC system 200, the current input signal sample, x(k), may be filtered by the estimated path filter 238. The filtered signal 334 may be provided to the IIR filter 202. The update signal sample (d*(k)) 307 may be provided to the first update filter 314. A backpropagation configuration may be implemented to update the coefficients of the filters 224, 226, and 228. The transfer function of the second filter 226 and third filter 228 may each represent a biquad section of the IIR filter 202. The form of the transfer function allows the possibility of system instability to occur based on the selected coefficients. Each update filter 314 and 322 may have the update coefficients of the adaptive update filter portions 316 and 326, respectively, determined based using the update system 300.

At step 408, the update coefficients determined for the update filters 314 and 322 may be checked for stability. In one example, this may be performed using Eqn. 9-11. The operation of FIG. 4 may be performed for each update filter 314 and 322. The operation may include a step 410 of determining if each determined coefficient of an update filter is stable. If the coefficients are all stable, a step 412 may be performed of updating the IIR filter 202 with the update coefficients. If the update coefficients are unstable, a step 414 may be performed of maintaining the current coefficients of the IIR filter 202. The steps 410 through 414 may be performed for each IIR filter in the ANC system. After the coefficient stability determinations and any coefficient updating have been performed, a step 416 of receiving a next input signal sample may be performed. Upon performance of step 416, the operation may perform step 400 using the next input signal sample.

Figure 5:
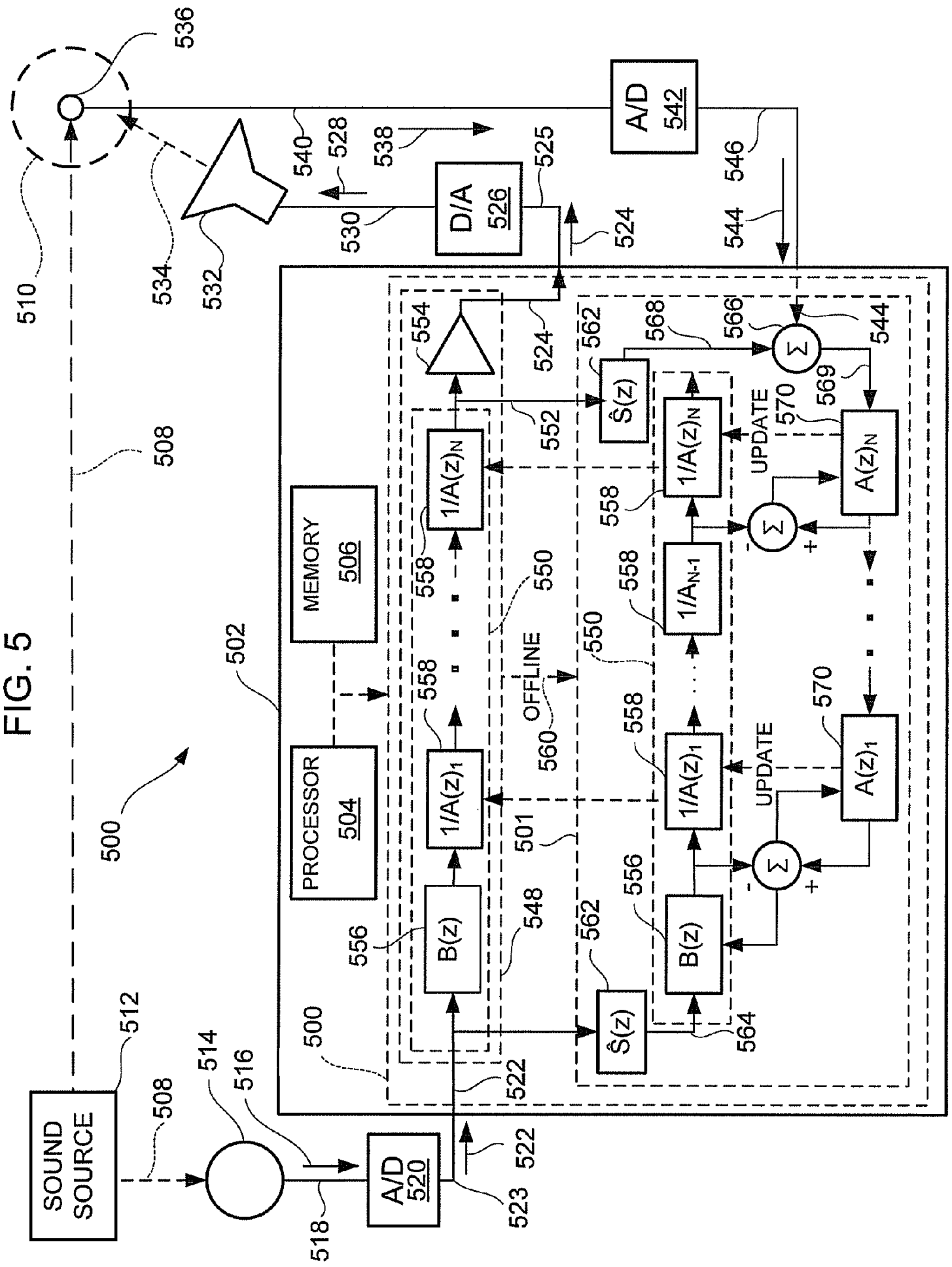
FIG. 5 is a system diagram of example computer that includes an ANC system.

FIG. 5 shows of an example ANC system 500 that may be implemented on a computer device 502. In one example, the computer device 502 may be an audio/video system, such as that used in vehicles or other suitable environment. The computer device 502 may include a processor 504 and a memory 506, which may be implemented to generate a software-based ANC system, such as the ANC system 500. The ANC system 500 may be implemented as instructions stored on the memory 506 executable by the processor 504. The memory 506 may be computer-readable storage media or memories, such as a cache, buffer, RAM, ROM, removable media, hard drive or other computer-readable storage media. Computer-readable storage media include various types of volatile and nonvolatile storage media. Various processing techniques may be implemented by the processor 504 such as multiprocessing, multitasking, parallel processing and the like, for example.

The ANC system 500 may be implemented to generate anti-noise to destructively interfere with an undesired sound 508 in a target space 510. The undesired sound 508 may emanate from a sound source 512. At least one sensor 514 may detect the undesired sound 508. The sensor 514 may be various forms of detection devices depending on a particular ANC implementation. For example, the ANC system 500 may be configured to generate anti-noise in a vehicle to destructively interfere with engine noise. The sensor 514 may be an accelerometer or vibration monitor configured to generate a signal based on the engine noise. The sensor 514 may also be a microphone configured to receive the engine noise as a sound wave in order to generate a representative signal for use by the ANC system 500. In other examples, any other undesirable sound may be detected within a vehicle, such as fan or road noise. The sensor 514 may generate an analog-based signal 516 representative of the undesired sound that may be transmitted through an electrical connection 518 to an analog-to-digital (A/D) converter 520. The A/D converter 520 may digitize the signal 516 and transmit the digitized signal 522 to the computer device 502 through a connection 523. In an alternative example, the A/D converter 520 may be instructions stored on the memory 506 that are executable by the processor 504.

The ANC system 500 may generate an anti-noise signal 524 that may be transmitted through a connection 525 to a digital-to-analog (D/A) converter 526. The D/A converter 526 may generate an analog-based anti-noise signal 528 that may be transmitted through an electrical connection 530 to a speaker 532 to drive the speaker to produce anti-noise sound waves as speaker output 534. The speaker output 534 may be transmitted to the target space 510 to destructively interfere with the undesired sound 508. In an alternative example, the D/A converter 526 may be instructions stored on the memory 506 and executed by the processor 504.

A microphone 536 or other sensing device may be positioned within the target space 510 to detect sound waves present within or proximate to the target space 510. The microphone 536 may detect sound waves remaining after occurrence of destructive interference between the speaker output 534 of anti-noise and the undesired sound 508. The microphone 536 may generate a signal 538 representative of the detected sound waves. The signal 538 may be transmitted through a connection 540 to an A/D converter 542 where the signal may be digitized as signal 544 and transmitted through a connection 546 to the computer 502. The signal 544 may represent an error signal similar to that discussed in regard to FIGS. 1 and 2. In an alternative example, the A/D converter 542 may be instructions stored on the memory 506 and executed by the processor 504.

As shown in FIG. 5, the ANC system 500 may operate in a manner similar to that described in regard to FIG. 2. The ANC system 500 may include an anti-noise generator 548 configured with an IIR filter 550. The IIR filter 550 may include a plurality of cascaded filters. As discussed with regard to FIG. 2, an IIR filter may include a transversal filter and a number of biquad filters. In FIG. 5, the number of coefficients may be chosen for the denominator portion of Eqn. 2, A(z), to produce N different biquads. The number N may vary per ANC system configuration. In one example N may be 10 biquads, but may be increased or decreased in number.

The IIR filter 550 may receive the input signal 522 indicative of the undesired sound 508 and generate an output signal 552. The output signal 552 may be provided to an inverter 554 to generate the anti-noise signal 524. As discussed with regard to FIGS. 2 and 3, coefficients of an IIR filter in an ANC system may be updated between generating an output signal sample based on an input signal sample. In FIG. 5, the IIR filter 550 includes a transversal filter 556 and N biquad section filters 558 designated as "$1/A(z)_1$" through "$1/A(z)_N$". The system of FIG. 5 may implement an update system 501 to update the coefficients in the filters 556 and 558 of the IIR filter 550.

In one example, the filters 556 and 558 of the IIR filter 550 may be updated when the ANC system is offline, as indicated by the arrow 560. The term "offline" may refer to the time between samples of the input signal 522 provided to the IIR filter 550. The processor 304 and memory 306 may be configured to execute the update system 501 of the ANC system 500 between samples being provided to the IIR filter 550. In one example, the update system 501 may be configured to receive each sample of the input signal 522 received by the IIR filter 550. The input signal sample may be provided to an estimated path filter 562 represented in FIG. 5 as Z-domain transfer function $\hat{S}(z)$. The estimated path filter 562 may represent an estimation of the effect on sound waves propagating along a path from the speaker 532 to the microphone 536, as well as components used to generate the anti-noise signal 524. In FIG. 5, the update system 501 is shown as part of the ANC system 500. In alternative examples, the coefficient update system 501 may be executed independently from the ANC system 500 by the computer device 502 or another computer device.

The update system 501 may include the filters present in the IIR filter 550. A filtered input signal 564 of the estimated path filter 562 may be provided to the IIR filter 550 in the update system 501. Similar to the update system 300 of FIG. 3, the output signal 552 of the IIR filter 550 may be implemented by the update system 501. In one example, the IIR filter output signal 552 may be provide to the estimated path filter 562. The filtered output signal 568 of the estimated path filter 562 may be provided to a summation operator 566. The filtered output signal 568 may be summed with the error signal 544 at the summation operator 566 to produce an update signal 569.

The coefficient update system 501 may include a plurality of update filters 570, designated individually as "$A(z)_1$" through "$A(z)_N$", with each one corresponding to one of the filters 558 and being configured to include the reciprocal of the transfer function of a corresponding filter 558. Similar to the update system 300 of FIG. 3, in the update system 501, a sample of the filtered input signal 564 may be provided to the transversal filter 556 of the update system 501 allowing the sample to be processed by the IIR filter 550. The update signal 569 may be provided as an input to the update filters 570. As the sample of the filtered input signal 564 is processed by the IIR filter 550 and the sample of the update signal 569 is processed by the update filters 570, intermediate output signals may be generated by the filters 556, 558, and 570 and provided to operators in an arrangement according to that shown in FIG. 5 and similar to that described in with regard to the update system 300.

The update coefficients of the filters 570 may be checked for stability using Eqns. 9-11. If all update coefficients of the filters 570 are determined to be stable, each filter 558 may be updated with the update coefficients of a corresponding filter 570. If any one of the update coefficients is determined to be unstable, none of the filters 556 and 558 may be updated and the filters 556 and 558 may use the current coefficients for the next input signal sample.

Figure 6:
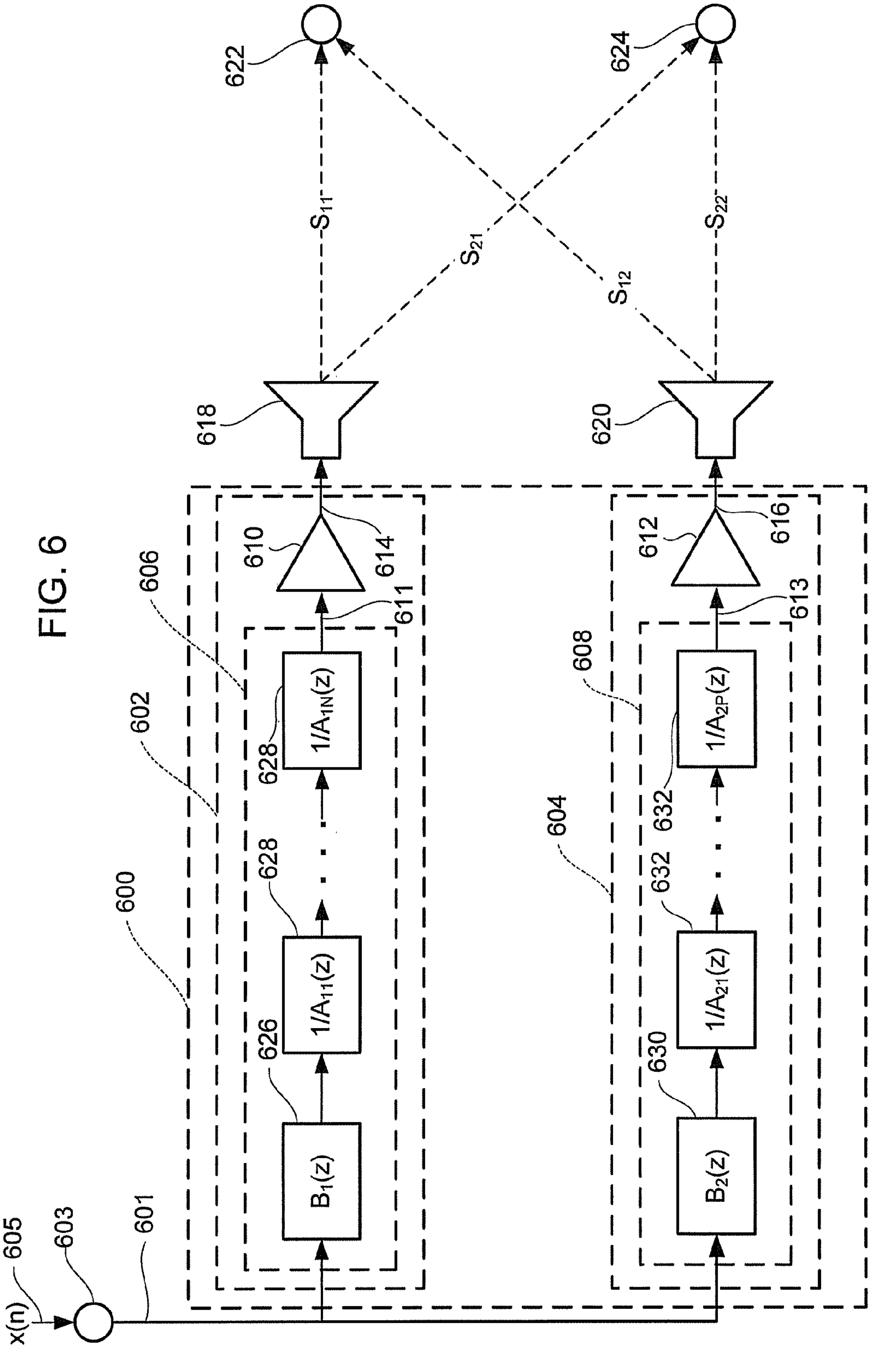
FIG. 6 is a block diagram of a multi-channel ANC system.

FIG. 6 shows a block diagram of an example multi-channel ANC system 600. In FIG. 6, the multi-channel ANC system 600 includes two channels, however, more channels may be implemented. The ANC system 600 includes a first anti-noise generator 602 and a second anti-noise generator 604. The first and second anti-noise generators 602 and 604 may each include at least one adaptive IIR filter. In FIG. 6, the first anti-noise generator 602 includes a first IIR filter 606 and the second anti-noise generator includes a second IIR filter 608. Each anti-noise generator 602 and 604 may include a first and second inverter 610 and 612, respectively, to invert a first filter output signal 611 and a second output filter signal 613, respectively, produced by the respective first IIR filter 606 and second IIR filter 608. A first anti-noise signal 614 and a second anti-noise signal 616 generated by the first anti-noise generator 602 and the second anti-noise generator 604, respectively, may drive a respective speaker 618 and 620 to produce anti-noise.

The ANC system 600 may include a first and second error microphone 622 and 624. Each error microphone 622 and 624 may be disposed in a space targeted to reduce or eliminate an undesired sound. Each error microphone 622 and 624 may receive anti-noise from both speakers 618 and 620. Secondary path $S_{11}$ may represent a path traversed by sound waves produced by the first speaker 618 to the first error microphone 622. Secondary path $S_{21}$ may represent a path traversed by sound waves produced by the first speaker 618 to the second error microphone 624. Secondary path $S_{22}$ may represent a path traversed by sound waves produced by the second speaker 620 to the second error microphone 624. Secondary path $S_{12}$ may represent a path traversed by sound waves produced by the second speaker 620 to the first error microphone 622.

In FIG. 6, a reference signal 601 representative of an undesired sound (x(n)) 605 generated by a sensor 603 may be provided to the first anti-noise generator 602 and the second anti-noise generator 604. Alternatively, the undesired sound 605 may be simulated allowing the simulated sound to be provided as an input signal to each anti-noise generator 602 and 604. The first IIR filter 606 may include a plurality of filters. The first IIR filter 606 may include a first filter 626 represented in FIG. 6 as $B_1(z)$. The first IIR filter 606 may also include a number of filters 628 each representing a biquad section filter of the IIR filter 606. In one example, the IIR filter 606 may include N biquad section filters 528 individually designated as "$1/A_{11}(z)$" through "$1/A_{1N}(z)$". Similarly, the second IIR filter 608 may include a first filter 630 represented as "$B_2(z)$" and a number of filters 632 each representing a biquad section. The IIR filter 608 may include P biquad section filters 632 individually designated as "$1/A_{21}(z)$" through "$1/A_{2P}(z)$". In FIG. 6, the first IIR filter 606 and the second IIR filter 608 may or may not include the same number of biquad sections N and P, respectively.

Figure 7:
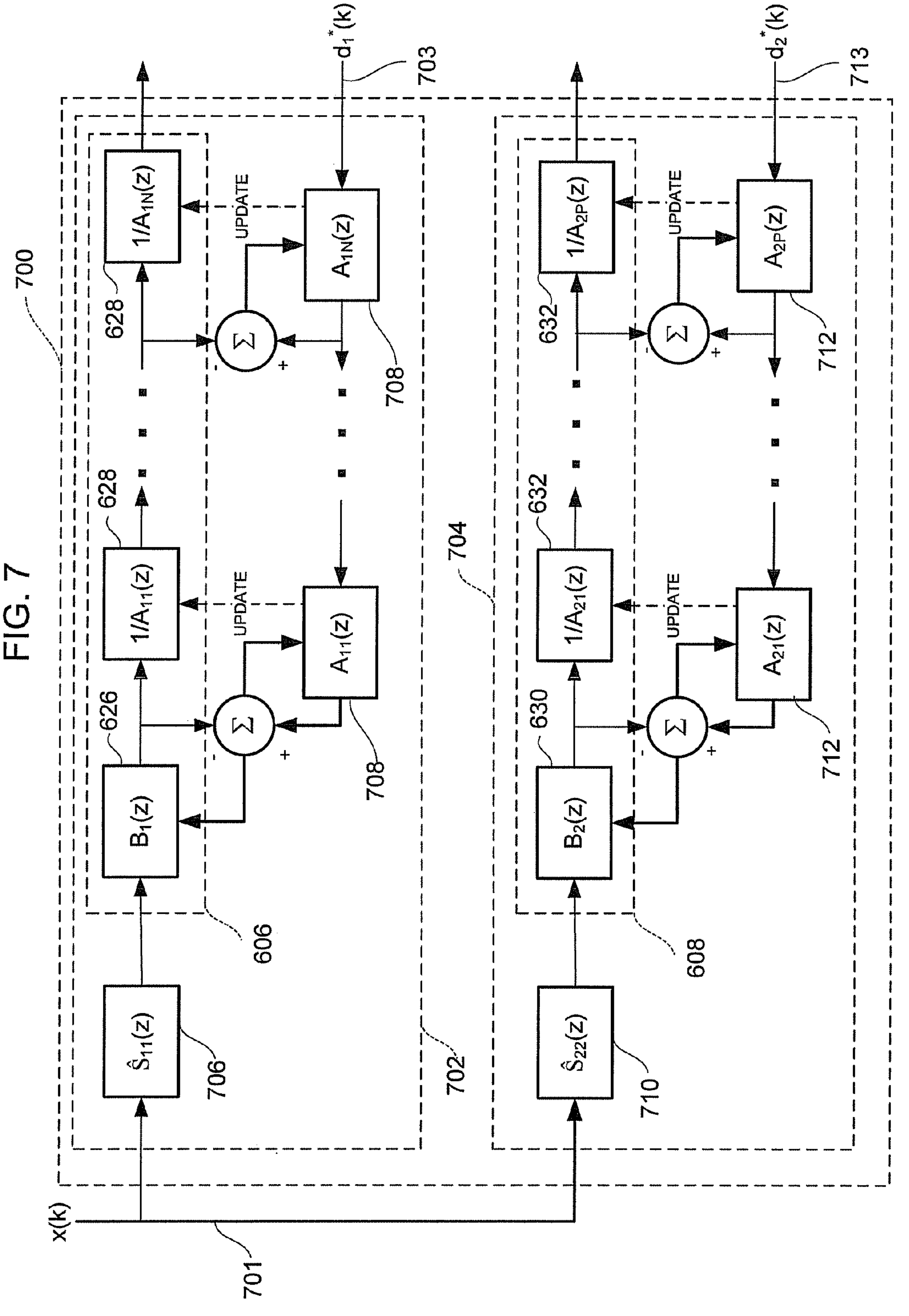
FIG. 7 is a block diagram of a coefficient update system implemented within the multi-channel ANC system of FIG. 6.
Figure 8:
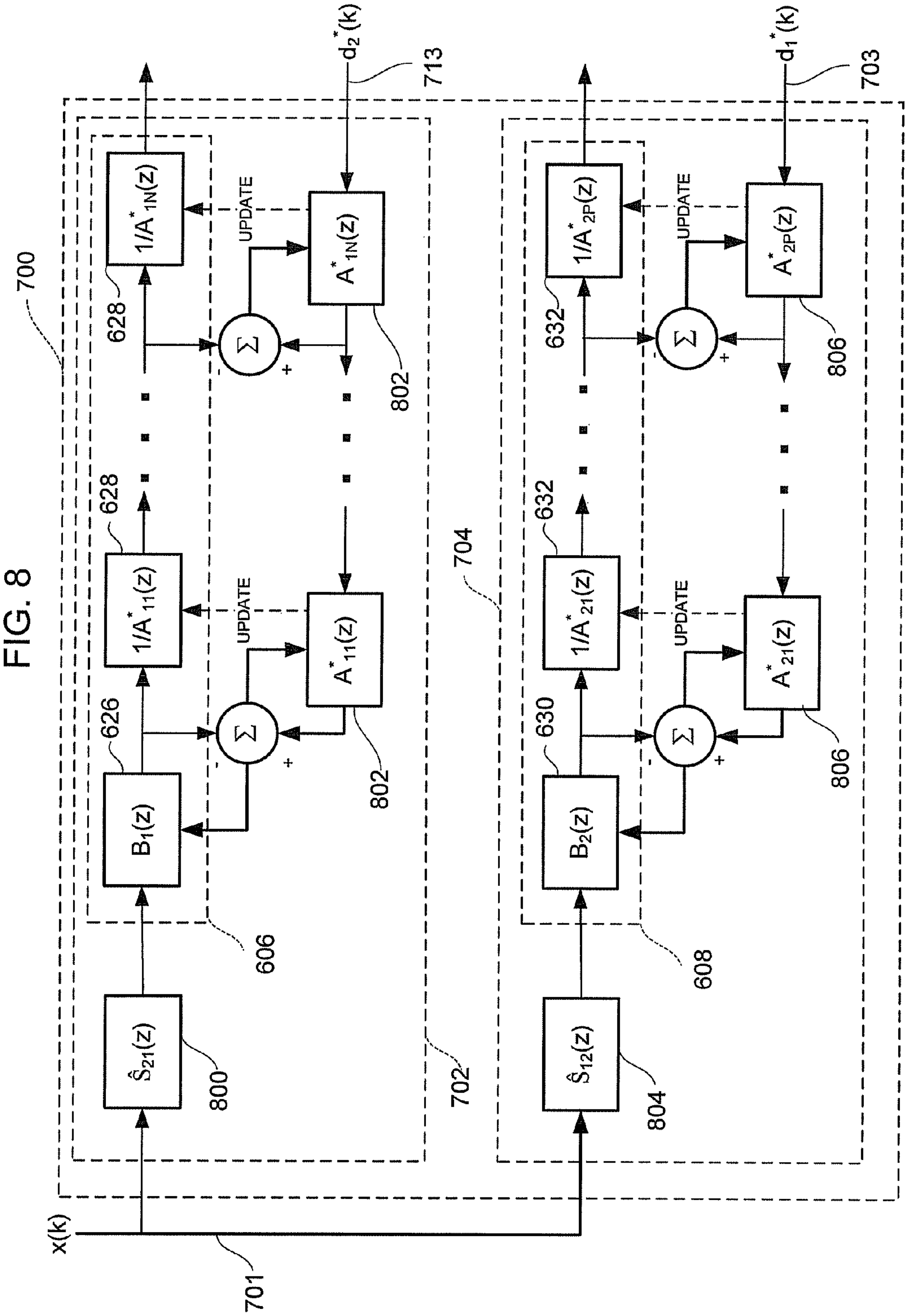
FIG. 8 is a block diagram of the coefficient update system of FIG. 7.

FIGS. 7 and 8 shows a block diagram of a filter update system 700 that may be used with the multi-channel ANC system 600. The update system 700 may operate independently from the ANC system 600 or as a part of the ANC system 600. The filter update system 700 may be configured to update the filter coefficients associated with the first and second IIR filters 606 and 608. The update system 700 may include a first filter update sub-system 702 and a second filter update sub-system 704. The first and second filter update sub-systems 702 and 704 may each be configured to update one of the first and second IIR filters 606 and 608, respectively.

The first and second filter update sub-systems 702 and 704 may operate in a manner similar to that described with regard to the filter update system 300, however, the sub-systems 702 and 704 may include multi-stage updating to account for the multi-channel configuration of the ANC system 600. FIG. 7 shows a first stage of updating coefficients of the first and second IIR filters 606 and 608. The first stage of the filter update sub-system 702 may be configured to include the first IIR filter 606 and a first estimated path filter 706. In FIG. 7, the first estimated path filter 706 may represent a transfer function estimate of the physical path from the first speaker 618 to the first error microphone 622 and the path traversed by a signal through components associated with the first speaker 618 and the first error microphone 622. The first estimated path filter 706 is represented as Z-transform transfer function $\hat{S}_{11}(z)$ in FIG. 7. The first filter update sub-system 702 may also include a number of first stage update filters 708.

In FIG. 7, an input signal sample (x(k)) 701 of the reference signal 601 representative of the undesired sound (x(n)) 605 is provided to the update sub-system 702. A first estimated undesired sound signal sample ($d^*_1(k)$) 703 may be provided to the first stage update filters 708. The first estimated undesired sound signal sample ($d^*_1(k)$) 703 may be representative of the estimated state of the undesired sound 605 at the error microphone 622.

The first stage of the update sub-system 702 may operate in a similar manner as the update system 300 in updating coefficients in the IIR filter 606. Each first stage update filter 708 is configured to include the reciprocal transfer function of a corresponding biquad section filter of the IIR filter 606. For example, one biquad section filter 628 of the first IIR filter 606 may be include a transfer function of $1/A_{11}(z)$, with $A_{11}(z)$ having a form similar to Eqn. 6. One of the first stage update filters 708 may include a corresponding filter having a transfer function of $A_{11}(z)$ in the same form as Eqn. 6. If the update coefficients determined with regard to the update filters 708 are stable, the coefficients associated with each update filter 708 may be used to update a corresponding biquad section filter 628. The updated coefficients may be determined through an arrangement involving intermediate output signals and intermediate error signals as shown in FIG. 6, similar to that described with regard to FIG. 3. If any one of the updated coefficients of the first stage update filters 708 is determined to be unstable, none of the filters 626 and 628 are updated and the current coefficients will be maintained.

The second update sub-system 704 may operate in substantially the same manner as the first update sub-system 702. The second update sub-system 704 may receive the undesired sound sample (x(k)) 701 and filter the sample x(k) with a second estimated path filter 710, represented by Z-domain transfer function $S_{22}(z)$. The second estimated path filter 710 may represent a transfer function estimate of the physical path between second speaker 620 and the second error microphone 624, as well as components associated with the second speaker 620 and the second error microphone 624. The second update sub-system 704 may include a number of first stage update filters 712. The first stage update filters 712 may be configured in manner similar to the first stage update filters 708. The end update filter 712, represented as $A_{2P}(z)$, may receive a second estimated undesired sound signal ($d_2^*(k)$) 713. The second estimated undesired sound signal $d_2^*(k)$ may represent the state of the undesired sound sample x(k) at the error microphone 624. The biquad section filters 632 may be updated in a manner similar to that described with regard to the first update sub-system 702. If any updated coefficient of first stage update filters 712 are determined to be unstable, none of the filters 630 and 632 are updated and the current coefficients may be maintained. The filters 626 and 630 and each of the first update filters 708 and 712 may include a filter portion and an LAU, similar to the update system 300 as similarly shown in FIG. 3.

Upon completion of the filter coefficient updates of the IIR filters 606 and 608 in the first stage, a second update stage may be implemented to account for the multi-channel arrangement. In FIG. 8, the IIR filters 606 and 608 may be updated to account for the $S_{21}$ and $S_{12}$ secondary paths, respectively, after the update shown in FIG. 7. The update sub-system 702 may include second stage update filters 802. The input signal sample (x(k)) 701 of the input signal x(n) representative of the undesired sound may be provided to a third estimated path filter 800 of the update sub-system 702. The second estimated undesired sound signal sample ($d^*_2(k)$) 713 may be provided to the second stage update filters 802. The third estimated path filter 800 may represent a transfer function estimate of the physical path from the first speaker 618 to the second error microphone 624 and the path traversed by a signal through components associated with the first speaker 618 and the second error microphone 624. The estimated path filter 800 is represented as Z-transform transfer function $\hat{S}_{21}(z)$ in FIG. 8.

The second stage of the update sub-system 702 may also operate in a similar manner as the update system 300 in updating coefficients in the IIR filter 606. In FIG. 8, the transfer function of each filter 628 is designated as "$1/A^*_{11}(z)$ through $1/A^*_{1N}(Z)$, where the "*" indicates that the filters 628 have been through the first update stage. Thus, the coefficients for the filters 628 in the second stage may be updated from those determined at the first stage or may be the coefficients prior to the first stage operation depending on the stability of the coefficients determined in the first stage. Each second stage update filter 802 is configured to include the reciprocal transfer function of a corresponding biquad section filter 628 of the IIR filter 606. If the update coefficients determined with regard to the second stage update filters 802 are stable, the coefficients associated with each second stage update filter 802 may be used to update a corresponding biquad section filter 628. The updated coefficients for the second stage may be determined through an arrangement involving intermediate output signals and intermediate error signals as shown in FIG. 6, similar to that described with regard to FIG. 3. If any updated coefficient of second stage update filters 802 are determined to be unstable, none of the filters 626 and 628 are updated and the current coefficients will be used for the next input signal sample x(k+1).

The second stage of the second update sub-system 704 may operate in substantially the same manner as the second stage of the first update sub-system 702. The second update sub-system 704 may receive the undesired sound sample 701 (x(k)) and filter the sample x(k) with a fourth estimated path filter 804, represented by Z-domain transfer function $\hat{S}_{12}(z)$. The fourth estimated path filter 804 may represent a transfer function estimate of the physical path between second speaker 620 and the first error microphone 622, as well as components associated with the second speaker 620 and the first error microphone 622. Similar to the second stage of the update sub-system 702, in the second stage of the update sub-system 704, the transfer function of each filter 632 is designated as "$1/A^*_{21}(z)$ through $1/A^*_{2P}(Z)$, where the "*" indicates that the filters 632 have been through the first stage. The second update sub-system 704 may include a number of second stage update filters 806. The second stage update filters 806 may be configured in manner similar to the second stage update filters 802. The end update filter 806, represented as $A^*_{2P}(Z)$, may receive the first estimated undesired sound signal ($d_1^*(k)$) 703. The biquad section filters 632 may be updated in manner similar to that described with regard to the first update sub-system 702. If any updated coefficient of second stage update filters 806 are determined to be unstable, none of the filters 630 and 632 are updated and the current coefficients will be used for the next input signal sample x(k+1). The second stage update filters 802 and 806 may include a filter portion and an LAU, similar to the update system 300 shown in FIG. 3.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A computer-readable medium encoded with computer executable instructions, the computer executable instructions executable with a processor to operate an active noise control system, the computer-readable medium comprising:
   - instructions executable to generate an output signal of an infinite impulse response filter based on an input signal representative of an undesired sound, the infinite impulse response filter comprising a plurality of cascaded filters;
   - instructions executable to generate an anti-noise signal based on the output signal of the infinite impulse response filter, where the anti-noise signal is configured to drive a speaker to produce sound waves to destructively interfere with an undesired sound;
   - instructions executable to generate an update signal based on the output signal of the infinite impulse response filter and an error signal representative of sound waves produced from a combination of the undesired sound and the sound waves produced by the speaker; and
   - instructions executable to independently update a plurality of coefficients included in each respective one of the cascaded filters of the infinite impulse response filter based on the update signal.

2. A computer-readable medium encoded with computer executable instructions, the computer executable instructions executable with a processor to operate an active noise control system, the computer-readable medium comprising:
   - instructions executable to generate an output signal of an infinite impulse response filter based on an input signal representative of an undesired sound;
   - instructions executable to generate an anti-noise signal based on the output signal of the infinite impulse response filter, where the anti-noise signal is configured to drive a speaker to produce sound waves to destructively interfere with an undesired sound;
   - instructions executable to generate an update signal based on the output signal of the infinite impulse response filter and an error signal representative of sound waves produced from a combination of the undesired sound and the sound waves produced by the speaker, where the instructions executable to generate an update signal comprise:
     - instructions executable to filter the output signal of the infinite impulse response filter with an estimated path filter to generate a filtered output signal; and
     - instructions executable to sum the filtered output signal with the error signal to generate the update signal: and
   - instructions executable to update a plurality of coefficients of the infinite impulse response filter based on the update signal.

3. The computer-readable medium of claim 1, where the instructions executable to update the plurality of coefficients of the infinite impulse filter comprises:
   - instructions executable to filter the input signal with an estimated path filter to generate a filtered input signal;
   - instructions executable to generate at least one intermediate output signal of the infinite impulse response filter based on the filtered input signal; and
   - instructions executable to update the plurality of coefficients based on the at least one intermediate output signal of the infinite impulse response filter.

4. The computer readable-medium of claim 3, where the instructions executable to update the plurality of coefficients of the infinite impulse response filter further comprise:
   - instructions executable to generate at least one update filter output signal from at least one update filter based on the at least one update signal; and
   - instructions executable to update the plurality of coefficients based on the at least one update filter output signal.

5. The computer-readable medium of claim 1, wherein the instructions executable to update a plurality of coefficients of the infinite impulse response filter comprise:
   - instructions executable to provide the update signal to at least one update filter;
   - instructions executable to generate at least one update filter output signal from the at least one update filter based on the at least one update signal; and
   - instructions executable to update the plurality of coefficients based on the at least one update filter output signal.

6. A computer-readable medium encoded with computer executable instructions, the computer executable instructions executable with a processor to operate an active noise control system, the computer-readable medium comprising:
   - instructions executable to generate an output signal of an infinite impulse response filter based on an input signal representative of an undesired sound;
   - instructions executable to generate an anti-noise signal based on the output signal of the infinite impulse response filter, where the anti-noise signal is configured to drive a speaker to produce sound waves to destructively interfere with an undesired sound;
   - instructions executable to generate an update signal based on the output signal of the infinite impulse response filter and an error signal representative of sound waves produced from a combination of the undesired sound and the sound waves produced by the speaker; and
   - instructions executable to update a plurality of coefficients of the infinite impulse response filter based on the update signal, wherein the instructions executable to update the plurality of filter coefficients comprise:
     - instructions executable to determine a plurality of update coefficients, each update coefficient corresponding to one of the plurality of coefficients of the infinite impulse response filter;
     - instructions executable to determine the stability of each of the update coefficients; and
     - instructions executable to replace each of the plurality of coefficients of the infinite impulse response filter with corresponding update coefficients when each of the plurality of update coefficients is determined to be stable.

7. A method of operating an active noise control system, the method comprising:
   - generating an output signal of at least one infinite impulse response filter based on an input signal representative of an undesired sound, the infinite impulse response filter comprising a plurality of cascaded filters;
   - generating anti-noise based on the output signal of the infinite impulse response filter;
   - generating an update signal based on the output signal of the infinite impulse response filter and an error signal representative of sound waves produced from a combination of the anti-noise and the undesired sound; and
   - independently updating a plurality of coefficients included in each respective one of the cascaded filters of the at least one infinite impulse response filter based on the output signal of the at least one infinite impulse response filter and the update signal.

8. A method of operating an active noise control system, the method comprising:

generating an output signal of at least one infinite impulse response filter based on an input signal representative of an undesired sound;

generating anti-noise based on the output signal of the infinite impulse response filter;

generating an update signal based on the output signal of the infinite impulse response filter and an error signal representative of sound waves produced from a combination of the anti-noise and the undesired sound;

updating a plurality of coefficients of the at least one infinite impulse response filter based on the output signal of the at least one infinite impulse response filter and the update signal; and filtering the output signal of the infinite impulse response filter with an estimated path filter to generate a filtered output signal;

where, generating an update signal further comprises summing the filtered output signal with the undesired sound signal to generate the update signal.

9. The method of claim 8, further comprising:

providing the update signal to at least one update filter; and generating at least one update filter output signal from the at least one update filter based on the update signal;

where, updating the plurality of coefficients further comprises updating the plurality of coefficients based on the at least one update filter output signal.

10. The method of claim 7, further comprising:

filtering the input signal with an estimated path filter to generate a filtered input signal; and generating at least one intermediate output signal of the infinite impulse response filter based on the filtered input signal;

where, updating the plurality of coefficients further comprises updating the plurality of coefficients based on the at least one intermediate output signal of the infinite impulse response filter.

11. The method of claim 10, further comprising generating at least one update filter output signal from at least one update filter based on the at least one update signal, wherein, updating the plurality of coefficients further comprises updating the plurality of coefficients based on the at least one update filter output signal.

12. A method of operating an active noise control system, the method comprising:

generating an output signal of at least one infinite impulse response filter based on an input signal representative of an undesired sound;

generating anti-noise based on the output signal of the infinite impulse response filter;

generating an update signal based on the output signal of the infinite impulse response filter and an error signal representative of sound waves produced from a combination of the anti-noise and the undesired sound; and updating a plurality of coefficients of the at least one infinite impulse response filter based on the output signal of the at least one infinite impulse response filter and the update signal by:

determining a plurality of update coefficients, each of the update coefficients corresponding to a respective one of the plurality of coefficients of the infinite impulse response filter;

determining the stability of each of the update coefficients; and replacing each of the plurality of coefficients of the infinite impulse response filter with corresponding update coefficients when each of the plurality of update coefficients is determined to be stable.

13. An active noise control system comprising:

a processor; and a memory connected to the processor, where the processor is configured to:

generate an output signal from an infinite impulse response filter based on an input signal representative of an undesired sound, where the finite impulse response filter comprises a plurality of cascaded filters;

generate an anti-noise signal based on the output signal of the infinite impulse response filter, where the anti-noise signal is configured to drive a speaker to produce sound waves to destructively interfere with an undesired sound;

generate an update signal based on the output signal of the infinite impulse response filter and an error signal representative of sound waves produced from a combination of the undesired sound and the sound waves produced by the speaker; and independently update a plurality of coefficients included in each respective one of the cascaded filters of the infinite impulse response filter based on the update signal.

14. An active noise control system comprising:

a processor; and a memory connected to the processor, where the processor is configured to:

generate an output signal from an infinite impulse response filter based on an input signal representative of an undesired sound;

generate an anti-noise signal based on the output signal of the infinite impulse response filter, where the anti-noise signal is configured to drive a speaker to produce sound waves to destructively interfere with an undesired sound;

filter the output signal of the infinite impulse response filter with an estimated path filter to generate a filtered output signal;

generate an update signal based on summation of the filtered output signal of the infinite impulse response filter and an error signal representative of sound waves produced from a combination of the undesired sound and the sound waves produced by the speaker; and update a plurality of coefficients of the infinite impulse response filter based on the update signal.

15. The active noise control system of claim 13, the processor further configured to:

filter the input signal with an estimated path filter to generate a filtered input signal;

generate at least one intermediate output signal of the infinite impulse response filter based on the filtered input signal; and update the plurality of coefficients based on the at least one intermediate output signal of the infinite impulse response filter.

16. The active noise control system of claim 15, the processor further configured to:

generate at least one update filter output signal from at least one update filter based on the at least one update signal; and update the plurality of coefficients based on the at least one update filter output signal and the at least one intermediate output signal.

17. The active noise control system of claim 13, the processor further configured to:

transmit the update signal to at least one update filter;

generate at least one update filter output signal from the at least one update filter based on the update signal; and update the plurality of coefficients based on the at least one update filter output signal.

18. An active noise control system comprising:

a processor; and a memory connected to the processor, where the processor is configured to:

generate an output signal from an infinite impulse response filter based on an input signal representative of an undesired sound;

generate an anti-noise signal based on the output signal of the infinite impulse response filter, where the anti-noise signal is configured to drive a speaker to produce sound waves to destructively interfere with an undesired sound;

generate an update signal based on the output signal of the infinite impulse response filter and an error signal representative of sound waves produced from a combination of the undesired sound and the sound waves produced by the speaker;

update a plurality of coefficients of the infinite impulse response filter based on the update signal;

determine a plurality of update coefficients, each of the update coefficients corresponding to a respective one of the plurality of coefficients of the infinite impulse response filter;

determine the stability of each of the update coefficients; and replace each of the plurality of coefficients of the infinite impulse response filter with corresponding update coefficients when each of the plurality of update coefficients is determined to be stable.

19. A method of operating an active noise control system, the method comprising:

providing a first input signal sample representative of an undesired sound to an infinite impulse response filter, the infinite impulse response filter comprising a plurality of cascaded filters;

generating an output signal sample of the infinite impulse response filter based on the first input signal sample;

generating an anti-noise signal sample based on the output signal sample, where the anti-noise signal sample is configured to drive a speaker to produce sound waves to destructively interfere with an undesired sound;

generating an error signal sample based on a combination of sound waves produced by the speaker and the undesired sound;

generating an update signal sample based on the error signal sample; and updating a plurality of coefficients included in each respective one of the cascaded filters included in the infinite impulse response filter before a second input signal sample representative of the undesired sound is provided to the infinite impulse response filter.

20. The method of claim 19, further comprising providing a second input signal sample representative of the undesired sound to the infinite impulse response filter, where the infinite impulse response filter includes the updated plurality of coefficients.

21. The method of claim 19, further comprising filtering the output signal sample of the infinite impulse response filter with an estimated path filter to generate a filtered output signal sample;

where, generating an update signal sample further comprises summing the filtered output signal sample with the undesired sound signal sample to generate the update signal sample.

22. The method of claim 19, further comprising:

filtering the first input signal sample with an estimated path filter to generate a first filtered input signal sample; and generating at least one intermediate output signal sample of the infinite impulse response filter based on the first filtered input signal sample;

where, updating the plurality of coefficients further comprises updating the plurality of coefficients based on the at least one intermediate output signal sample of the infinite impulse response filter.

23. The method of claim 22, further comprising generating at least one update filter output signal sample from at least one update filter based on the at least one update signal sample, wherein, updating the plurality of coefficients further comprises updating the plurality of coefficients based on the at least one update filter output signal sample.

24. The method of claim 19, further comprising:

providing the update signal sample to at least one update filter; and generating at least one update filter output signal sample from the at least one update filter based on the update signal sample;

where, updating the plurality of coefficients further comprises updating the plurality of coefficients based on the at least one update filter output signal sample.

25. The method of claim 19, where updating the plurality of coefficients comprises:

determining a plurality of update coefficients, each of the update coefficients corresponding to a respective one of the plurality of coefficients of the infinite impulse response filter;

determining the stability of each of the update coefficients; and replacing each of the plurality of coefficients of the infinite impulse response filter with the corresponding update coefficients when each of the plurality of update coefficient is determined to be stable.

* * * * *